US 10,115,463 B1

(12) United States Patent
Jiang et al.

(10) Patent No.: US 10,115,463 B1
(45) Date of Patent: Oct. 30, 2018

(54) VERIFICATION OF A RAM-BASED TCAM

(71) Applicant: Xilinx, Inc., San Jose, CA (US)

(72) Inventors: Weirong Jiang, San Jose, CA (US); Denis Rystsov, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 209 days.

(21) Appl. No.: 14/750,947

(22) Filed: Jun. 25, 2015

(51) Int. Cl.
*G11C 15/04* (2006.01)
*G06F 11/07* (2006.01)

(52) U.S. Cl.
CPC .......... *G11C 15/04* (2013.01); *G06F 11/0727* (2013.01); *G06F 11/0751* (2013.01)

(58) Field of Classification Search
CPC ... G11C 15/04; G06F 11/0727; G06F 11/0751
See application file for complete search history.

(56) References Cited

U.S. PATENT DOCUMENTS

| 8,923,463 | B1 | 12/2014 | Jenkins et al. | |
| 9,319,316 | B2* | 4/2016 | Ansari | H04L 45/745 |
| 2003/0108043 | A1 | 6/2003 | Liao | |
| 2003/0223421 | A1* | 12/2003 | Rich | H04L 45/00 |
| | | | | 370/389 |
| 2004/0205292 | A1* | 10/2004 | Lu | H04L 45/7453 |
| | | | | 711/108 |
| 2007/0115986 | A1* | 5/2007 | Shankara | H04L 63/145 |
| | | | | 370/392 |
| 2007/0171911 | A1* | 7/2007 | Ku | H04L 45/00 |
| | | | | 370/392 |
| 2012/0246400 | A1* | 9/2012 | Bhadra | H04L 49/3009 |
| | | | | 711/104 |
| 2013/0315247 | A1* | 11/2013 | Olakangil | H04L 43/026 |
| | | | | 370/392 |

OTHER PUBLICATIONS

Address bus, https://en.wikipedia.org/w/index.php?title=Address_bus&oldid=736226576 (last visited Oct. 1, 2016), pp. 1-2.*
U.S. Appl. No. 14/043,679, Jiang, Weirong, filed Oct. 1, 2013, San Jose, CA USA.
Jiang, Weirong et al., "Field-Split Parallel Architecture for High Performance Multi-Match Packet Classification Using FPGAs," Aug. 11, 2009, pp. 188-196, 21st ACM Symposium on Parallelism in Algorithms and Architectures, ACM, New York, New York, USA.
Locke, Kyle, Parameterizable Content-Addressable Memory, XAPP1151 (v1.0), Mar. 1, 2011, pp. 1-31, Xilinx, Inc., San Jose, California, USA.
Zerbini, Carlos A., "Performance Evaluation of Packet Classification on FPGA-based TCAM Emulation Architectures," 2012 IEEE Global Communications Conference, Dec. 3, 2012, pp. 2766-2771, IEEE, Piscataway, New Jersey, USA.

* cited by examiner

*Primary Examiner* — Kyle Vallecillo
(74) *Attorney, Agent, or Firm* — Robert M. Brush

(57) ABSTRACT

In an example, an integrated circuit (IC) includes a memory including at least one random access memory (RAM). Each of the at least one RAM stores bits representing match vectors indicative of whether search keys match ternary rules. The IC further includes a verification circuit, coupled to the memory, operable to verify the bits stored in the at least one RAM by performing at least one of: decoding at least one of the ternary rules from the bits stored in the at least one RAM; or checking the bits stored in the at least one RAM against expected content of at least one of the ternary rules.

19 Claims, 9 Drawing Sheets

VERIFICATION OF A RAM-BASED TCAM

TECHNICAL FIELD

Examples of the present disclosure generally relate to electronic circuits and, in particular, to verification of a random access memory (RAM)-based ternary content-addressable memory (TCAM) in an integrated circuit (IC).

BACKGROUND

A content-addressable memory (CAM) is a type of memory used in certain high-speed searching applications. In general, a CAM compares input search data (referred to as "keys", "input keys", or "search keys") against a table of stored rules (also referred to as CAM words) and returns an indication of matching rules. The indication of matching rules can be the data of interest or can be used to obtain the data of interest. A binary CAM (BCAM) is the simplest type of CAM that uses input keys to search through stored rules consisting entirely of logic 1's and 0's. A ternary CAM (TCAM) is a CAM that allows for a third matching state of "*" or "don't care" for one or more bits in each of the stored rules being compared with the input keys. TCAMs are widely used in communication and networking systems. Digital logic that employs two logic states (logic '0' and 'logic 1') can be used to emulate a TCAM. Wider and/or deeper TCAMs require more complex emulation in digital logic. More complex emulation in digital logic can lead to errors and incorrect emulation of the TCAM.

SUMMARY

Techniques for providing verification of a random access memory (RAM)-based ternary content-addressable memory (TCAM) in an integrated circuit (IC) are described. In an example, an integrated circuit (IC) includes a memory including at least one random access memory (RAM). Each of the at least one RAM stores bits representing match vectors indicative of whether search keys match ternary rules. The IC further includes a verification circuit, coupled to the memory, operable to verify the bits stored in the at least one RAM by performing at least one of: decoding at least one of the ternary rules from the bits stored in the at least one RAM; or checking the bits stored in the at least one RAM against expected content of at least one of the ternary rules.

In another example, a method of verifying a RAM-based TCAM includes sending addresses to a RAM emulating at least a portion of a TCAM, the addresses being search keys, the RAM storing match vectors indicative of whether the search keys match ternary rules; selecting bits from words output by the RAM in response to the addresses; and generating a data word and a mask word representing a ternary rule in response to the addresses and the bits.

In another example, a method of verifying a RAM-based TCAM includes: sending addresses to a RAM emulating at least a portion of a TCAM, the addresses being search keys, the RAM storing match vectors indicative of whether the search keys match ternary rules; selecting bits from words output by the RAM in response to the addresses; selecting a mask word and a data word representing content of a ternary rule; and generating error bits representing validity of the match vectors stored in the RAM in response to the addresses, the bits, the mask word, and the data word.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
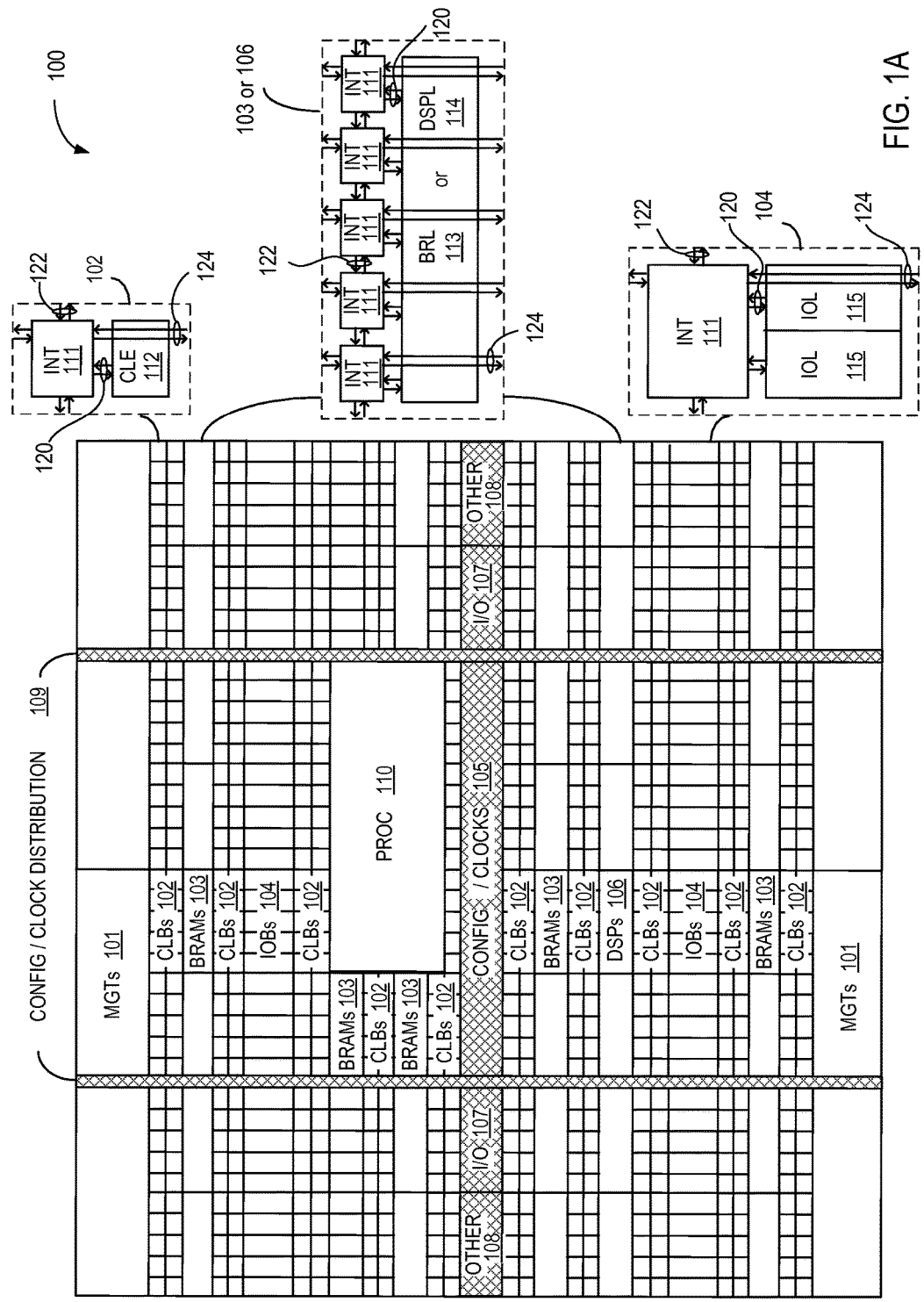
FIG. 1A illustrates an example architecture of an FPGA.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated, or if not so explicitly described.

Techniques for providing verification of a random access memory (RAM)-based ternary content-addressable memory (TCAM) in an integrated circuit (IC) are described. TCAMs are widely used in communication and networking systems. When implementing a TCAM in RAM(s), the RAM(s) are populated to encode the ternary rules. The techniques described herein can be used to verify that the bits populating the RAM(s) correctly encode the ternary rules. In an example, a TCAM unit having one or more RAMs is coupled to a verification circuit. The verification circuit is coupled to address port(s) and data port(s) of the RAM(s). The verification circuit can perform one or more verification operations either sequentially or concurrently (in parallel). Example verification operations include decoding selected ternary rule(s) from bits stored in the RAM(s) and checking bits stored in the RAM(s) against expected content of selected ternary rule(s). The architecture of the verification circuit is modular and can be scaled to verify bits in one or more RAMs. A given verification circuit can be shared by a plurality of RAMs across one or more TCAM units. The verification unit can be implemented in an IC, such as a programmable IC.

FIG. 1A illustrates an example architecture of an FPGA 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108, such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1A. Each programmable interconnect element 111 (also referred to as "interconnect element 111") can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA. As described further below, in some examples, some or all of the interconnect elements 111 can include additional circuitry for efficient implementation of TCAMs.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured example, a horizontal area near the center of the die (shown in FIG. 1A) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1A include additional logic blocks that disrupt the regular columnar structure making up a large part of the FPGA. The additional logic blocks can be programmable blocks and/or dedicated logic. For example, processor block 110 spans several columns of CLBs and BRAMs. The processor block 110 can include various components ranging from a single microprocessor to a complete programmable processing system of microprocessor(s), memory controllers, peripherals, and the like.

Note that FIG. 1A is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1A are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. In another example, an FPGA can include an entire processing system (e.g., processor, memory, peripherals, etc.) instead of, or in addition to, the processor block 110. In such an implementation, a System-on-Chip (Soc) can include a programmable fabric (programmable logic as shown in FPGA 100) in communication with a processing system.

Figure 1B:
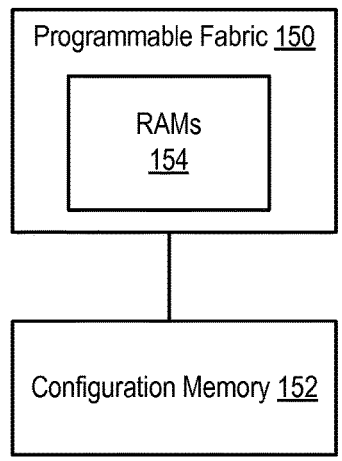
FIG. 1B is a block diagram depicting a higher-level view of the FPGA according to an example.

FIG. 1B is a block diagram depicting a higher-level view of the FPGA 100 according to an example. The FPGA 100 includes a programmable fabric 150, which can include the various programmable tiles described above. The programmable fabric 150 is coupled to a configuration memory 152. The configuration memory 152 comprises a random access memory (RAM), such as a static RAM (SRAM) or the like. The programmable fabric 150 can also include RAMs 154, such as BRAMs, distributed LUT-RAMs, and the like. The configuration memory 152 can be loaded with a configuration bitstream for programming ("configuring") the programmable fabric 150. For example, a configuration bitstream can be loaded into the configuration memory 152 to configure one or more TCAMs with verification circuit(s) in the programmable fabric 150, as described herein.

Figure 2:
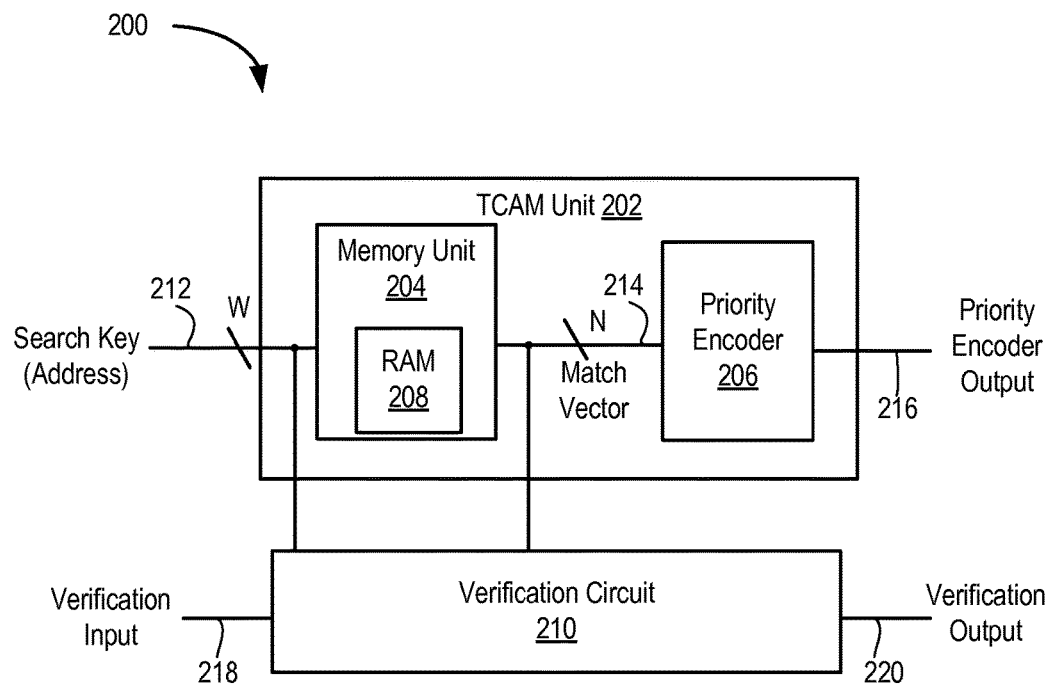
FIG. 2 is a block diagram depicting an example of a ternary content addressable memory (TCAM) system.

FIG. 2 is a block diagram depicting an example of a TCAM system 200. The TCAM system 200 can be implemented in a programmable IC, such as the FPGA 100 described above. Alternatively, the TCAM system 200 can be implemented in other types of integrated circuits (ICs), such as application specific integrated circuits (ASICs) and the like. The TCAM system 200 includes a TCAM unit 202 coupled to a verification circuit 210. The TCAM unit 202 emulates a TCAM. The verification circuit 210 is operable to perform one or more verification operations to verify the emulation implemented by the TCAM unit 202. In an example, the verification circuit 210 can decode ternary rule(s) from data stored in the TCAM unit 202 ("decoding operations"). In another example, the verification circuit 210 can check data stored in the TCAM unit 202 against expected ternary rule(s) ("checking operations"). In other examples, the verification circuit 210 can perform a combination of decoding and checking operations.

The TCAM unit 202 includes a memory unit 204 and a priority encoder 206. In the example shown, the memory unit 204 comprises a RAM 208. In other examples, the memory unit 204 can include a plurality of RAMs (described below). The TCAM unit 202 emulates an N×W bits TCAM, where N and W are positive integers representing the depth and width of the TCAM, respectively. That is, the TCAM stores N W-bit ternary rules (also referred to as TCAM words). The TCAM unit 202 includes a W-bit bus 212 configured to receive search keys (W-bit values). The W-bit bus 212 is coupled to an address port of the RAM 208 and thus the search keys are also addresses in the address space of the RAM 208. The TCAM unit 202 includes an N-bit bus 214 configured to provide match vectors (N-bit values). The N-bit bus 214 is coupled to a data port of the RAM 208 and thus the match vectors are also words stored in the RAM 208. Accordingly, in the example shown, the RAM 208 comprises a 2W×N bits RAM, where $2^W$ is the depth of the RAM 208 and N is the width of the RAM 208. For example, to emulate a 3×4 bits TCAM, the RAM 208 can have a depth of 16 and a width of 3.

In operation, the TCAM unit 202 receives a search key as input on the w-bit bus 212. The search key is coupled to the RAM 208 as an address. The RAM 208 outputs a word at the address as a match vector for the search key. The match vector includes a bit for each ternary rule defined for the emulated TCAM. A given bit of the match vector indicates whether a given ternary rule matches the search key. For example, Table 1 shows an example set of three ternary rules for an example 3×4 bits TCAM.

TABLE 1

| Ternary Rule Index | Ternary Rule |
|---|---|
| 0 | 10*1 |
| 1 | 1*1* |
| 2 | *00* |

In Table 1, an * in a ternary rule indicates a "don't care" bit. For a search key of 1001, ternary rules 0 and 2 match, and ternary rule 1 does not match. Thus, the match vector can include a bit sequence 101 indicating that the $0^{th}$ and $2^{nd}$ ternary rules match the search key, and that the $1^{st}$ ternary rule does not match the search key. The RAM 208 stores a match vector for each possible search key. In the example of Table 1, the RAM 208 stores match vectors for ternary rules 0-2 for each of the 16 search keys 0000-1111. In general, the RAM 208 stores bits representing match vectors indicative of whether search keys match ternary rules.

An input of the priority encoder 206 is coupled to the n-bit bus 214 to receive the N-bit match vectors. The priority encoder 206 includes an output coupled to an output 216 of the TCAM unit 202 ("priority encoder output"). The priority encoder 206 can output a word having one or more bits in response to each N-bit match vector obtained from the RAM 208. For example, the priority encoder 206 can use a weighting algorithm to select and output an index of a particular ternary rule that matches the search key (out of multiple possible matches).

The verification circuit 210 includes a port coupled to the W-bit bus 212, and a port coupled to the N-bit bus 214. The verification circuit 210 can include an input 218 ("verification input"). The verification circuit 210 can include an output 220 ("verification output").

In operation, the verification circuit 210 can perform one or more verification operations on the bits stored in the RAM 208. In an example, one verification operation is performed by decoding a ternary rule from the bits stored in the RAM 208. One or more ternary rules can be decoded from the bits stored in the RAM 208 using the decoding operation. The verification circuit 210 can receive a command to perform the decoding operation using the verification input. In addition, the verification circuit 210 can receive particular index (es) for ternary rule(s) to decode through the verification input. Alternatively, the verification circuit 210 can decode all ternary rules represented by the bits in the RAM 208 in response to the command to perform the decoding operation. The verification circuit 210 can output the results of the decoding operation in the verification output. The results can include a data word and corresponding mask word representing each decoded ternary rule.

In another example, a verification operation includes checking the bits stored in the RAM 208 against expected content of selected ternary rule(s). The bits (match vectors) in the RAM 208 can be checked against the expected content of one or more ternary rules using the checking operation. The verification circuit 210 can receive particular index(es) for ternary rule(s) to check along with data word(s) and mask word(s) for the expected content through the verification input. The verification circuit 210 can output the results of the checking operation in the verification output. The results can include set(s) of bits indicative of whether the ternary rule(s) are incorrectly emulated by the match vectors stored in the RAM 208 ("error bits").

Figure 3:
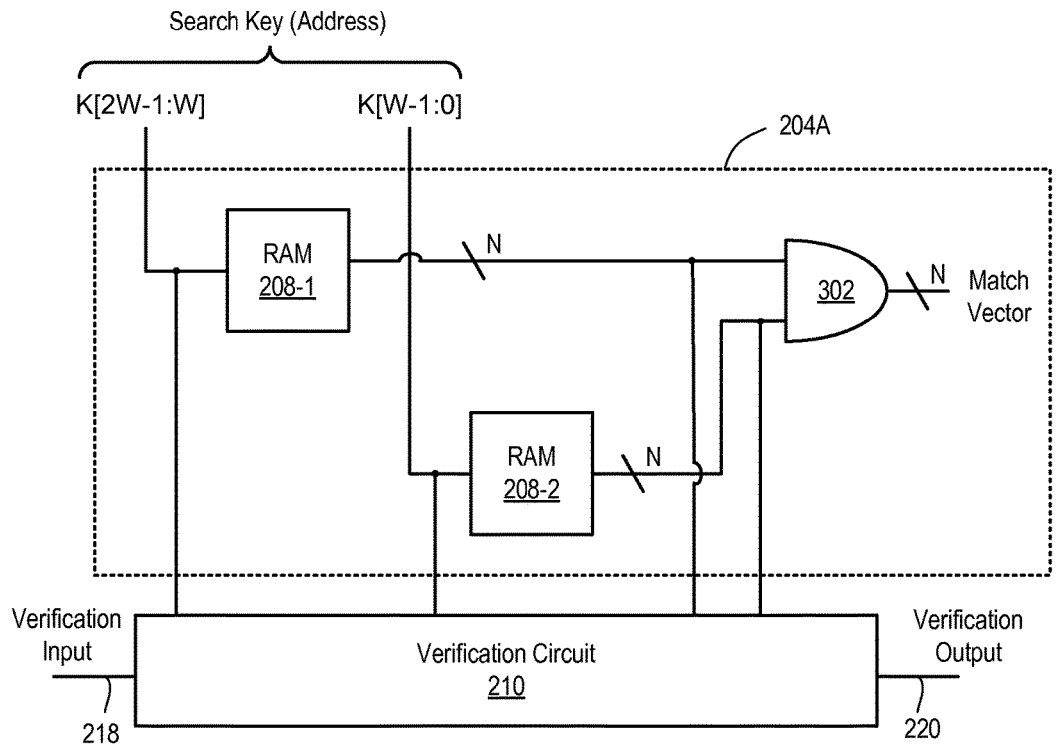
FIG. 3 is a block diagram depicting an example of a memory unit having a pair RAMs that emulate a TCAM.

In the example described in FIG. 2, the memory unit 204 includes a single RAM 208. In other examples, a memory unit of the TCAM unit 202 can include a plurality of RAMs. FIG. 3 is a block diagram depicting an example of a memory unit 204A having a pair of RAMs 208-1 and 208-2. The memory unit 204A emulates an N×$2^W$ TCAM, that is, a TCAM that is twice as wide as the TCAM emulated by the memory unit 204 shown in FIG. 2. An address port of the RAM 208-2 receives W least-significant bits of a search key K (K[W−1:0]). An address port of the RAM 208-1 receives W most-significant bits of the search key K (K[$2^W$−1:W]). Each of the RAMs 208-1 and 208-2 output an N-bit word having a match vector. The RAM 208-2 outputs match vectors corresponding to the first half of the search key, and the RAM 208-1 outputs match vectors corresponding to the second half of the search key. The data ports of the RAMs 208-1 and 208-2 are coupled to inputs of an AND gate 302. The AND gate 302 performs a bitwise-AND operation using the N-bit word from the RAM 208-1 and the N-bit word from the RAM 208-2 as operands. The N-bit output of the AND gate 302 provides a match vector for the complete search key.

The verification circuit 210 can be coupled to the address ports of the RAMs 208-1 and 208-2 and the data ports of the RAMs 208-1 and 208-2. The verification circuit 210 can perform verification operation(s) on the bits stored in each of the RAMs 208-1 and 208-2 in a manner similar to the RAM 208 in FIG. 2. In this manner, the verification circuit 210 can be used by more than one RAM to verify emulation of a TCAM. While two RAMs 208-1 and 208-2 are shown in FIG. 3, in general, a TCAM can be implemented using a plurality of RAMs and the verification circuit 210 can be used to verify bits in the plurality of RAMs.

As described above, the verification circuit 210 can be used to verify that the RAM(s) of a TCAM unit store the correct bits for emulating a TCAM having the desired set of ternary rules. In a decoding operation, the verification circuit 210 receives an index of a ternary rule to decode and outputs data and mask words representing the content of the ternary rule. The decoding operation can be repeated for a plurality of ternary rules. In a checking operation, the verification circuit 210 receives both an index of a ternary rule to check and data and mask words representing expected content, and outputs a set of error bits indicative of whether the RAM stores the correct bits to represent the ternary rule. The checking operation can be repeated for a plurality of ternary rules. In another example, both the decoding and checking operations can be performed either concurrently or sequentially for one or more selected ternary rules.

The decoding operation involves the problem of reconstructing the ternary rules (also referred to as "TCAM words") given a populated RAM. Consider an N×W bits TCAM implemented by a $2^W$×N bits RAM. Assume the following definitions:

Let $T^n$ be the n-th ternary rule for n=0, 1, . . . , N−1.
Let $T^n[i]$ be the i-th bit of $T^n$ for i=0, 1, . . . , W−1.
Let R[k] be the k-th word in the RAM for k=0, 1, . . . , $2^W$−1.
Let R[k][n] by the n-th bit of R[k] for n=0, 1, . . . , N−1.
Let S(n) be the set of addresses (search keys) where the RAM words have the n-th bit set to '1', that is, S(n)={k|R[k][n]=1, k=0, 1, . . . , $2^W$−1}. The set S(n) includes the search keys that match $T^n$.
Let k[i] be the i-th bit of a search key k.

Ternary rules can be decoded from the populated RAM according to the following:

$T^n[i]$=*, if and only if ∃ (a, b) where a∈S(n), b∈S(n), a[i]=0, and b[i]=1;
$T^n[i]$=0, if and only if ∀ a∈S(n), a[i]=0; and
$T^n[i]$=1, if and only if ∀ a∈S(n), a[i]=1.

The input to the decoding operation includes a populated RAM (R[0:$2^W$−1][0:N−1]) and an index, n, of a ternary rule to be decoded. The output of the decoding operation includes data and mask words that represent a W-bit ternary rule. The data word indicates whether the bits of the W-bit ternary rule are '1' or '0', and the mask word indicates whether the bits of the W-bit ternary rule are '*'. For example, a '0' in the mask word can be used to represent a "don't care" ('*') bit in the ternary rule. A '1' in the mask word indicates that the corresponding bit in the data word is used to represent the corresponding bit in the ternary rule (a '1' or a '0'). For example, a ternary rule 10*1 can be represented as (data=1001, mask=1101). In another example, the mask word can be configured such that a '1' represents a "don't care" bit in the ternary rule, and a '0' indicates that the corresponding bit in the data word is used to represent a bit in the ternary rule. In such case, a ternary rule 10*1 can be represented as (data=1001, mask=0010).

The decoding algorithm can be performed according to the following pseudocode:

Initialize a=$2^W$−1, b=0
For i=0 to $2^W$−1 do
  If R[i][n]==1 then
    a=a & i
    b=b|i
  End If
End For
data=a
mask=a^b In the pseudocode, the operator "&" performs a bitwise AND operation, the operator "|" performs a bitwise OR operation, and the operator "^" performs an exclusive OR operation. In the example pseudocode, the mask is formed such that a '1' indicates a "don't care" bit in the ternary rule.

The mask can also be formed by mask=!(a^b), where the operator "!" indicates a bitwise inversion (effectively performing an exclusive NOR operation for a and b). In such case, the mask would be formed such that a '0' indicates a "don't care" bit in the ternary rule. Thus, in general, the mask word comprises an exclusive combination of the values a and b.

Figure 4:
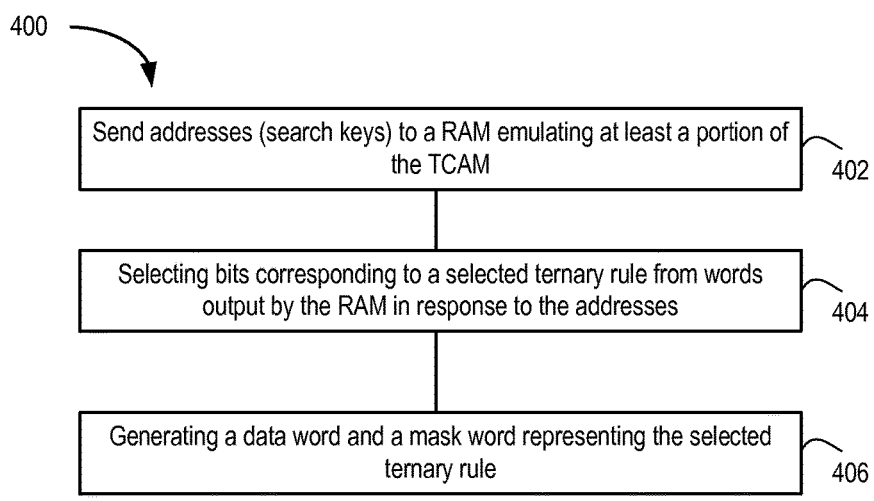
FIG. 4 is a flow diagram depicting an example method of verifying a RAM-based TCAM.

FIG. 4 is a flow diagram depicting an example method 400 of verifying a RAM-based TCAM. The method 400 is an example implementation of the decoding operation performed by the verification circuit 210. At operation 402, the verification circuit 210 sends addresses (search keys) to a RAM emulating at least a portion of the TCAM. In an example, the verification circuit 210 sequences through the search keys, as represented by the "for" loop in the above pseudocode. As discussed above, a TCAM unit can include multiple RAMs, in which case the RAM referred to in the method 400 emulates only a portion of the TCAM. Alternatively, the TCAM unit can include a single RAM, in which case the RAM referred to in the method 400 emulates the entire TCAM. In case of multiple RAMs, the method 400 can be performed for each of the RAMs either concurrently (in parallel) or sequentially.

At operation 404, the verification circuit 210 selects bits corresponding to a selected ternary rule from words output by the RAM in response to the addresses. The selected ternary rule corresponds to the n-th ternary rule in the pseudocode above, and the selected bits include R[i][n] for i=0, 1, . . . , $2^W$−1.

At operation 406, the verification circuit 210 generates a data word and a mask word representing the selected ternary rule. The data and mask words can be generated by performing the algorithm described in the above pseudocode. The method 400 can be repeated for a plurality of selected ternary rules to be reconstructed.

Figure 5:
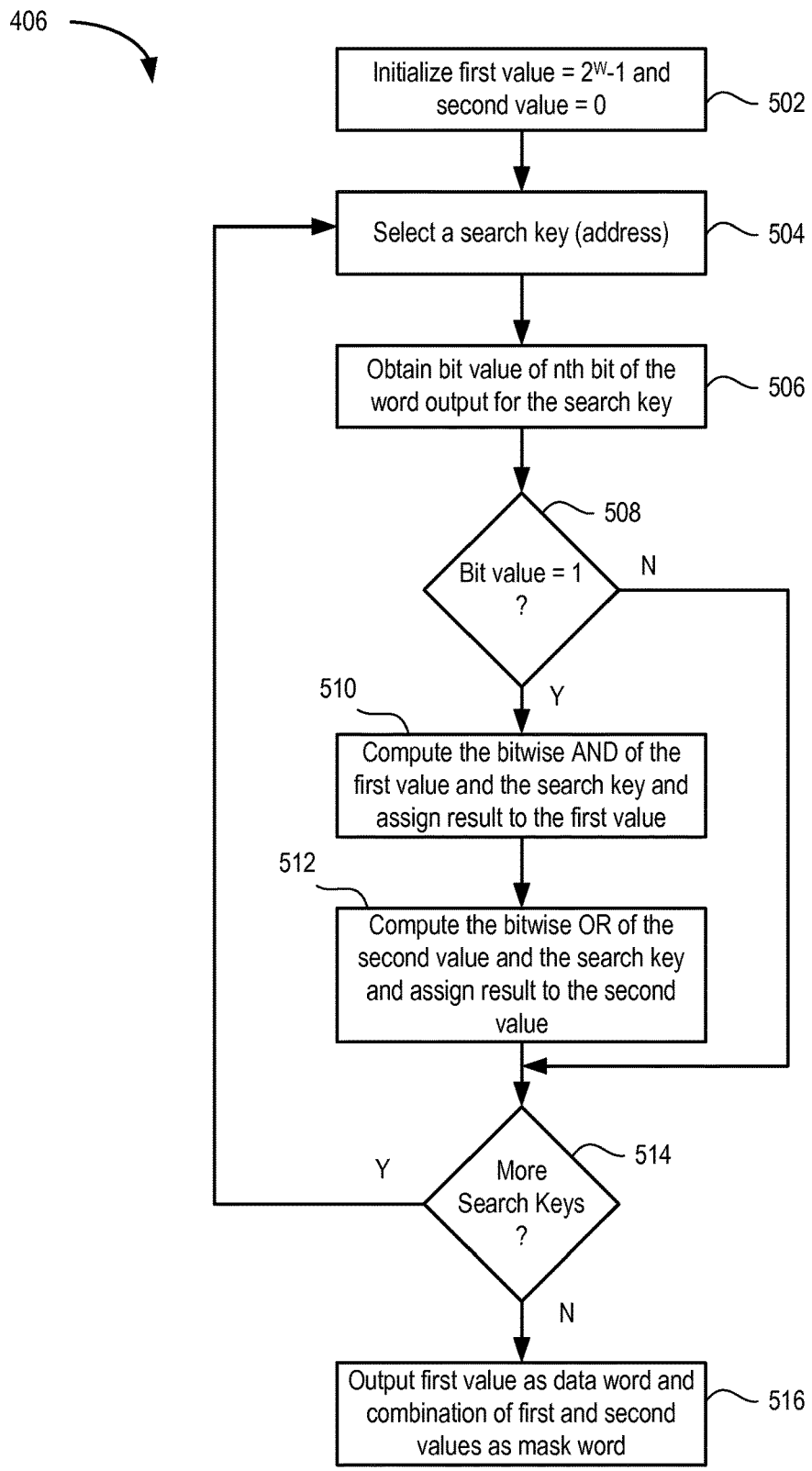
FIG. 5 is a flow diagram depicting an example method of generating a data word and a mask word representing a ternary rule.

FIG. 5 is a flow diagram depicting an example method 500 of generating a data word and a mask word representing a ternary rule that can be used in the operation 406 of the method 400 in FIG. 4. At operation 502, the verification circuit 210 initializes a first value to be $2^W$−1 and a second value to be zero. With respect to the example pseudocode, the first value is "a" and the second value is "b". At operation 504, the verification circuit 210 selects a search key (address). With respect to the example pseudocode, the search key is "i". At operation 506, the verification circuit 210 obtains a bit value of the nth bit of the word output for the search key. That is, the verification circuit 210 obtains R[i][n] from the RAM.

At operation 508, the verification circuit 210 determines whether the bit value is a logic '1'. If so, the method 500 proceeds to operation 510. Otherwise, the method 500 proceeds to operation 514. At operation 510, the verification circuit 210 computes the bitwise AND of the first value and the search key and assigns the result to the first value. At operation 512, the verification circuit 210 computes the bitwise OR of the second value and the search key and assigns the result to the second value.

At operation 514, the verification circuit 210 determines whether there are more search keys to process. If so, the method 500 returns to operation 504 and the verification circuit 210 selects another search key. Otherwise, the method 500 proceeds to operation 516, where the verification circuit 210 outputs the first value as the data word and a combination of the first and second values as the mask word. The combination can be an exclusive OR operation or an exclusive NOR operation.

Figure 6:
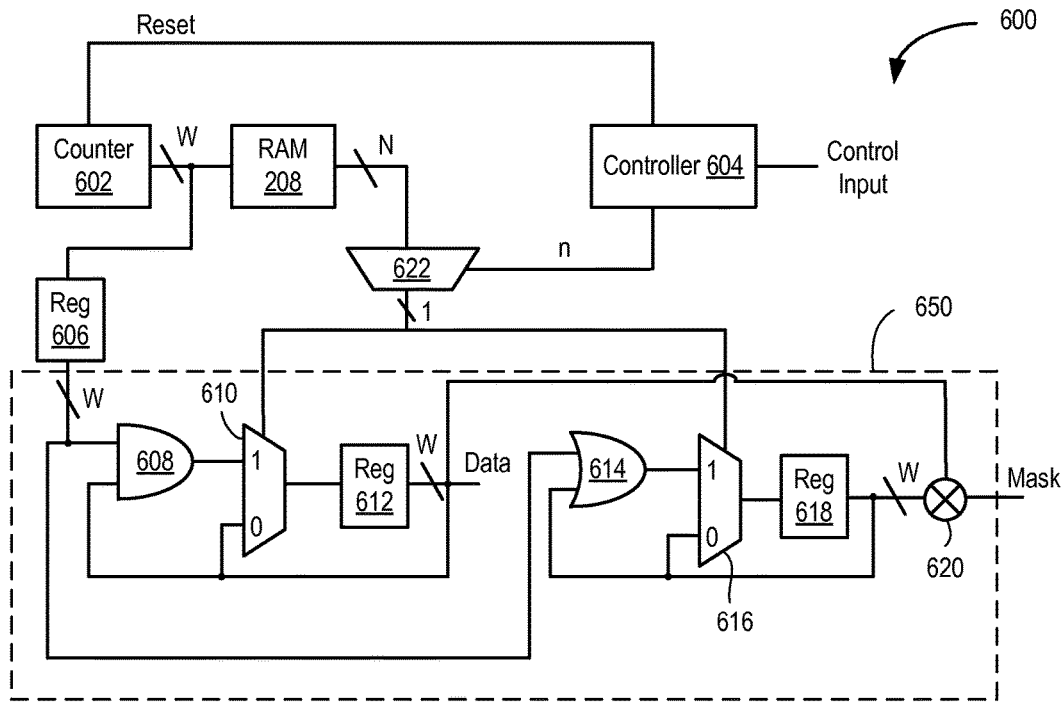
FIG. 6 is a block diagram depicting a circuit that can be used to implement the methods of FIGS. 4 and 5.

FIG. 6 is a block diagram depicting a circuit 600 that can be used to implement the methods 400 and 500 in the verification circuit 210. The circuit 600 is coupled to the address and data ports of the RAM 208. The circuit 600 includes a counter 602, a controller 604, a register 606, a multiplexer 622, and a decoder circuit 650. The decoder circuit 650 includes an AND gate 608, a multiplexer 610, a register 612, an OR gate 614, a multiplexer 616, a register 618, and an exclusive OR gate 620. The counter 602 is operable to provide addresses (search keys) to the RAM 208. In the example, the counter 602 is a W-bit counter operable to output W-bit addresses. The counter 602 is operable to sequence through the addresses (search keys). The controller 604 can reset the counter 602 through a reset port of the counter 602. The RAM 208 outputs a word (match vector) in response to each address. In the example, the RAM 208 outputs N-bit words.

The multiplexer 622 includes an N-bit input operable to receive the words output by the RAM 208. The multiplexer 622 includes a control input coupled to the controller 604. The controller 604 operates to cause the multiplexer 622 to select the n-th bit of the word output by the RAM 208. An output of the multiplexer 622 comprises a 1-bit output coupled to control inputs of the multiplexers 610 and 616.

The output of the counter 602 is coupled to an input of the register 606. The register is a W-bit register operable to store an address (search key) generated by the counter 602. The AND gate 608 includes an input coupled to an output of the register 606, and an input coupled to an output of the register 612. An output of the AND gate 608 is coupled to an input of the multiplexer 610 (the "1" input). The output of the register 612 is coupled to another input of the multiplexer 610 (the "0" input). An output of the multiplexer 610 is coupled to an input of the register 612. The AND gate 608 performs a bitwise AND operation using the output of the register 606 and the output of the register 612 as operands. The multiplexer 610 selects either the output of the AND gate 608 or the output of the register 612 depending on the 1-bit value output by the multiplexer 622. The register 612 stores the output of the multiplexer 610. If the 1-bit value output by the multiplexer 622 is a '1', then the multiplexer 610 selects the output of the AND gate 608. If the 1-bit value output by the multiplexer 622 is a '0', then the multiplexer 610 selects the output of the register 612.

The OR gate 614 includes an input coupled to the output of the register 606, and an input coupled to an output of the register 618. An output of the OR gate 614 is coupled to an input of the multiplexer 616 (the "1" input). The output of the register 618 is coupled to another input of the multiplexer 616 (the "0" input). An output of the multiplexer 616 is coupled to an input of the register 618. The OR gate 614 performs a bitwise OR operation using the output of the register 606 and the output of the register 618 as operands. The multiplexer 616 selects either the output of the OR gate 614 or the output of the register 618 depending on the 1-bit value output by the multiplexer 622. If the 1-bit value output by the multiplexer 622 is a '1', then the multiplexer 616 selects the output of the OR gate 614. If the 1-bit value output by the multiplexer 622 is a '0', then the multiplexer 616 selects the output of the register 618.

One input of the exclusive OR gate 620 is coupled to an output of the register 612, and another input of the exclusive OR gate 620 is coupled to an output of the register 618. An output of the exclusive OR gate 620 provides a W-bit mask word. An output of the register 612 provides a W-bit data word. In another example, the output of the exclusive OR gate 620 can be inverted (effectively providing an exclusive NOR operation).

The controller 604 can implement a state machine that selects a ternary rule to reconstruct and resets the counter 602 for each ternary rule. The controller 604 can include a control input that commands the controller to initiate the decoding operation. The control input can also be used to select which ternary rule to be reconstructed.

As discussed above, the verification circuit 210 can also perform a checking operation. The input to the checking operation is a populated RAM (e.g., $R[0:2^W-1][0:N-1]$), the index (n) of a ternary rule to be checked, and a (data, mask) representing the expected content of the ternary rule to be checked. The output of the checking operation includes a set of 1-bit indicators that indicates whether the bits in the RAM are correct for the checked ternary rule. The checking operation can be performed according to the following pseudocode:

```
For i=0 to 2^W-1 do
    If match(i, data, mask)==1 then
        If R[i][n]==0 then return Error
    Else
        If R[i][n]==1 then return Error
    End If
End For
```

In the pseudocode, "data" and "mask" are the data and mask words, respectively, for the expected content of the n-th ternary rule. The function match( ) outputs a '1' if the search key i matches the ternary rule represented by the data and mask, and outputs a '0' otherwise.

Figure 7:
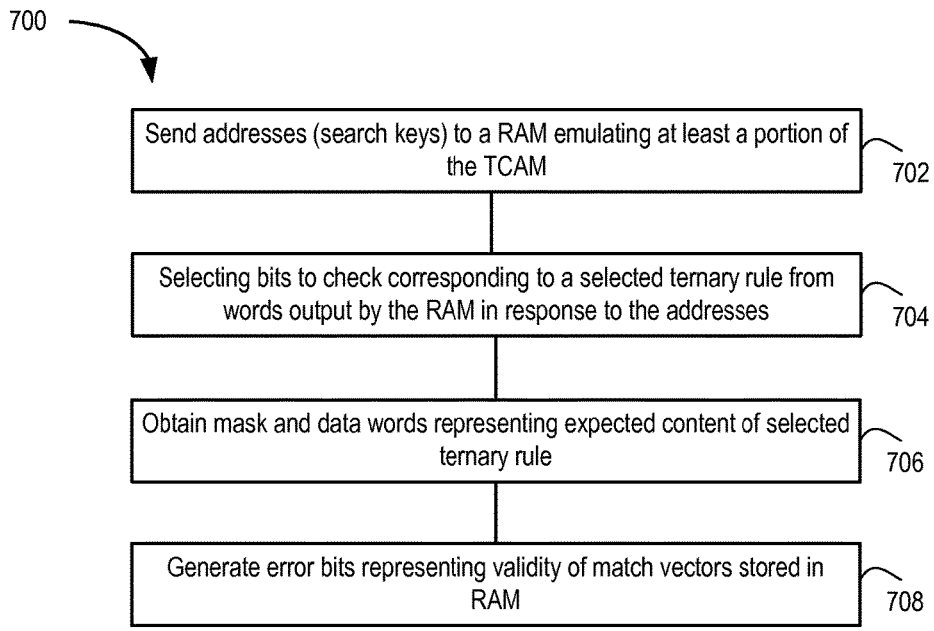
FIG. 7 is a flow diagram depicting another example method of verifying a RAM-based TCAM.

FIG. 7 is a flow diagram depicting an example method 700 of verifying a RAM-based TCAM. The method 700 is an example implementation of the checking operation performed by the verification circuit 210. At operation 702, the verification circuit 210 sends addresses (search keys) to a RAM emulating at least a portion of the TCAM. In an example, the verification circuit 210 sequences through the search keys, as represented by the "for" loop in the above pseudocode. As discussed above, a TCAM unit can include multiple RAMs, in which case the RAM referred to in the method 700 emulates only a portion of the TCAM. Alternatively, the TCAM unit can include a single RAM, in which case the RAM referred to in the method 700 emulates the entire TCAM. In case of multiple RAMs, the method 700 can be performed for each of the RAMs either concurrently (in parallel) or sequentially.

At operation 704, the verification circuit 210 selects bits corresponding to a selected ternary rule from words output by the RAM in response to the addresses. The selected ternary rule corresponds to the n-th ternary rule in the pseudocode above, and the selected bits include R[i][n] for $i=0, 1, \ldots, 2^W-1$.

At operation 706, the verification circuit 210 obtains mask and data words representing the expected content of the selected ternary rule to be checked. At operation 708, the verification circuit 210 generates error bits representing the validity of bits (match vectors) stored in the RAM. For example, for $2^W$ addresses in the RAM, the verification circuit 210 outputs $2^W$ error bits. Alternatively, the verification circuit 210 can output one bit that changes value $2^W$ times. Each error bit indicates the validity of a corresponding word (match vector) in the RAM given the expected content of the selected ternary rule to be checked.

Figure 8:
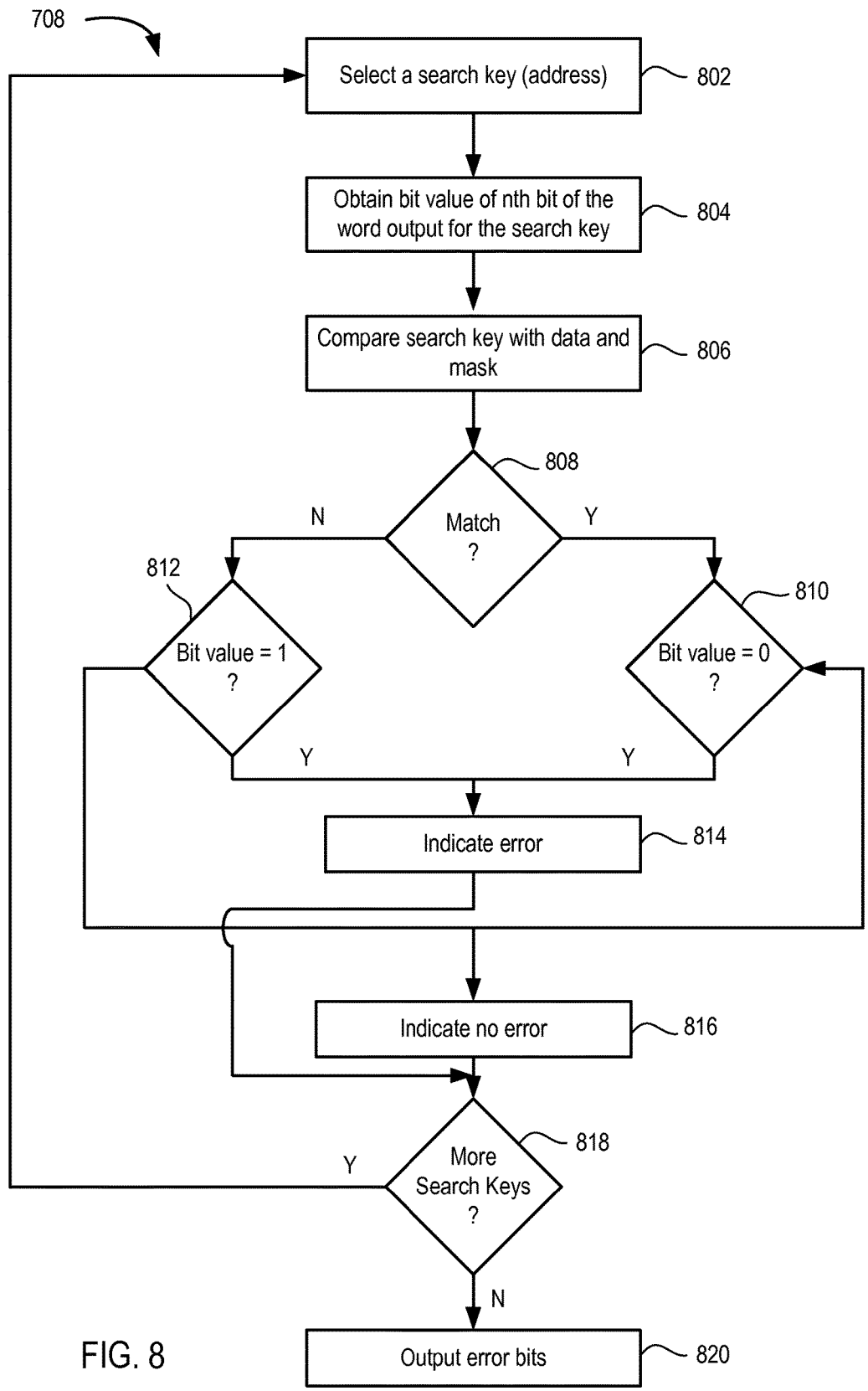
FIG. 8 is a flow diagram depicting an example of a method of generating error bits during the method of FIG. 7.

FIG. 8 is a flow diagram depicting an example of a method 800 of generating error bits that can be used in the operation 708 shown in FIG. 7. The method 800 begins at operation 802, where the verification circuit 210 selects a search key (address). At operation 804, the verification circuit 210 obtains a bit value of the n-th bit of the word output for the search key. At operation 806, the verification circuit 210 compares the search key with the data and mask representing the expected content of the selected ternary rule.

At operation 808, the verification circuit 210 determines whether the search key matches the expected content of the ternary rule being checked. If so, the method 800 proceeds to operation 810. Otherwise, the method 800 proceeds to operation 812.

At operation 810, the verification circuit 210 determines whether the bit value for the n-th bit of the word output obtained in operation 804 is a logic '0'. If so, the method 800 proceeds to operation 814, where the verification circuit 210 includes an error. Otherwise, the method 800 proceeds to operation 816, where the verification circuit 210 indicates no error.

At operation 812, the verification circuit 210 determines whether the bit value for the n-th bit of the word output obtained in operation 804 is a logic '1'. If so, the method 800 proceeds to operation 814, where the verification circuit 210 includes an error. Otherwise, the method 800 proceeds to operation 816, where the verification circuit 210 indicates no error.

After operations 814 or 816, the method 800 proceeds to operation 818. At operation 818, the verification circuit 210 determines whether there are more search keys to process. If so, the method 800 returns to operation 802 and repeats for another selected search key. Otherwise, the method 800 proceeds to operation 820, where the verification circuit 210 outputs the error bits. Alternatively, the verification circuit 210 can change the value of a single error bit for each iteration of the method 800 at either operation 814 or operation 816.

Figure 9:
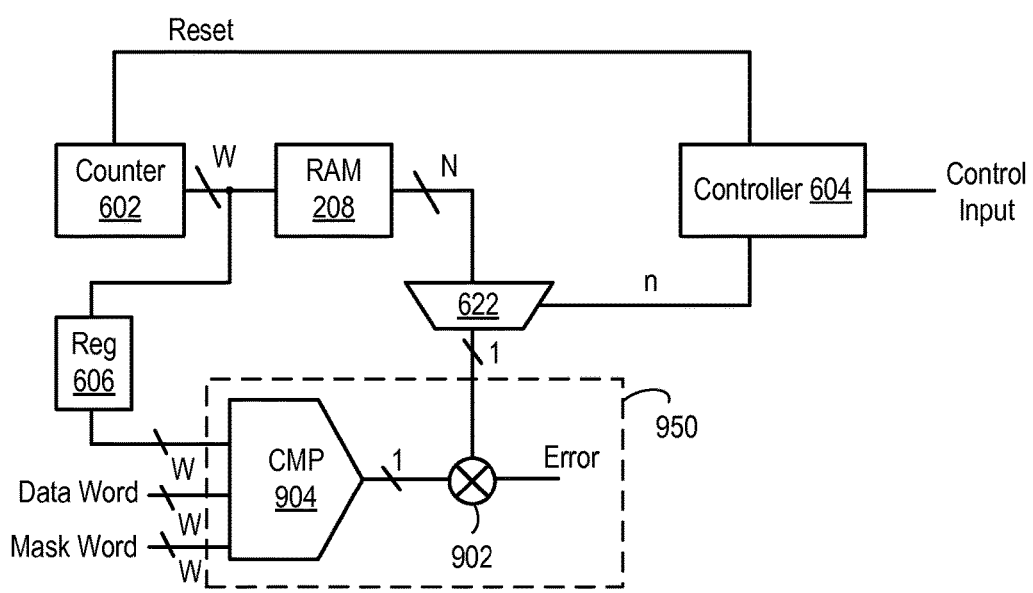
FIG. 9 is a block diagram of a circuit that can be used to implement the methods of FIGS. 7 and 8.

FIG. 9 is a block diagram of a circuit 900 that can be used to implement a checking operation as described above in FIGS. 7 and 8. The circuit 900 can be part of the verification circuit 210. The circuit 900 can include elements similar to those of the circuit 600 described above. In such case, similar elements are designed with identical reference numerals and are described in detail above.

The circuit 900 includes a counter 602, a controller 604, a register 606, a multiplexer 622, and a compare circuit 950. The compare circuit 950 comprises a compare circuit 904 and an exclusive OR gate 902. The counter 602, the controller 604, and the multiplexer 622 function as described above to output addresses and select values for the n-th bit of the RAM words. The controller 604 can perform the checking operation in response to control input. The controller 604 can receive an index for the ternary rule to be check through the control input.

The compare circuit 904 includes an input coupled to the output of the register 606, an input to receive a data word of the expected content, and an input to receive mask word of the expected content. Each input of the compare circuit 904 is a W-bit input. The compare circuit 904 includes a 1-bit output. The compare circuit 904 is operable to determine if the address (search key) in the register 606 matches the expected content as represented as the data and mask words. The output of the compare circuit 904 is a logic '1' in case of a match, and a logic '0' in case of no match.

The exclusive OR gate 902 has an input coupled to the output of the compare circuit 904 and another input coupled to the output of the multiplexer 622. The exclusive OR gate 902 includes an output that provides a 1-bit error signal. The exclusive OR gate 902 performs an exclusive OR operation given the 1-bit value output by the compare circuit 904 and the 1-bit value output by the multiplexer 622. As the counter increments, assertion of the error signal indicates that the RAM word at the current address is incorrect given the expected content. If after all addresses have been processed the error signal has not been asserted, then the RAM 208 stores the correct bits to represent the expected content of n-th ternary word.

Figure 10A:
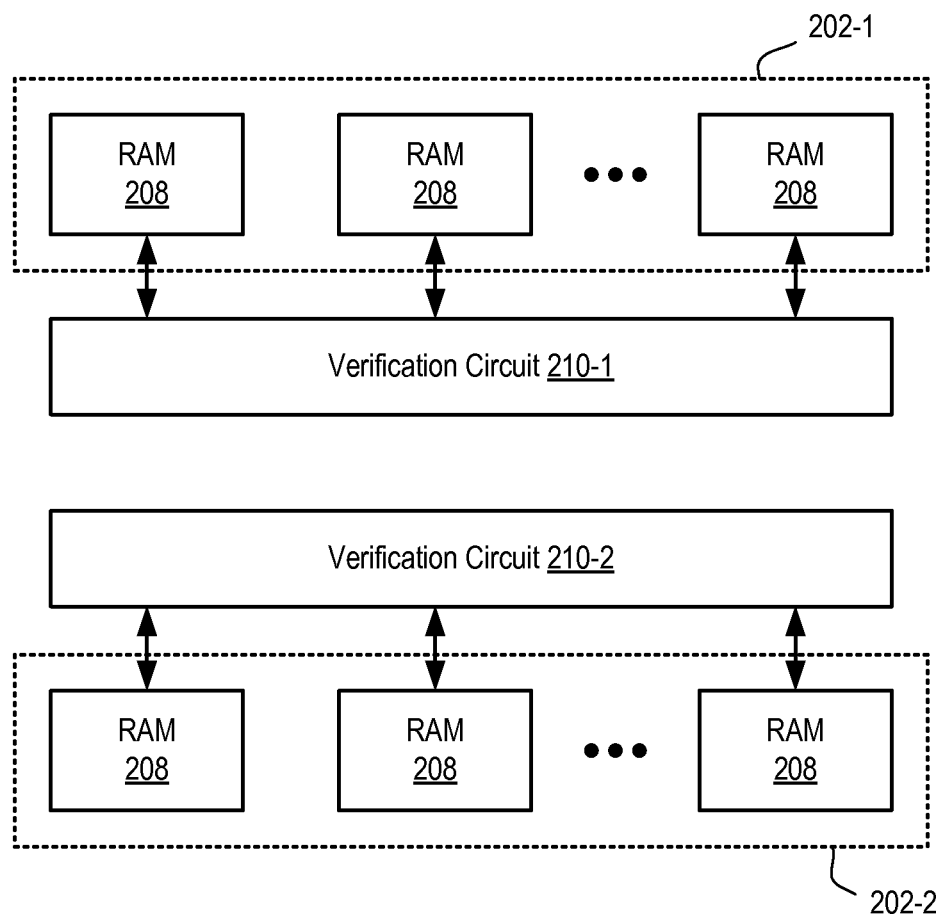
FIGS. 10A-10C are block diagrams showing different configurations for sharing a verification circuit among a plurality of RAMs.
Figure 10B:
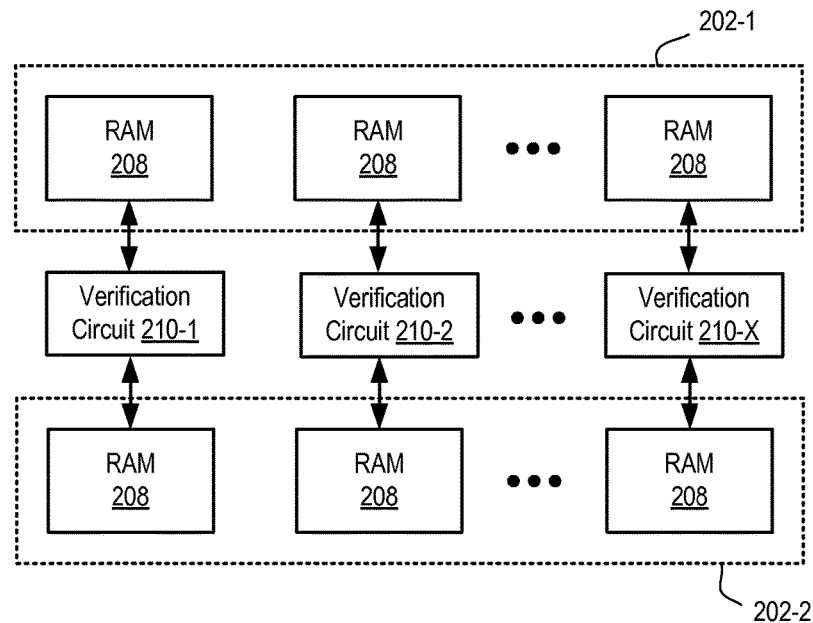
Figure 10C:
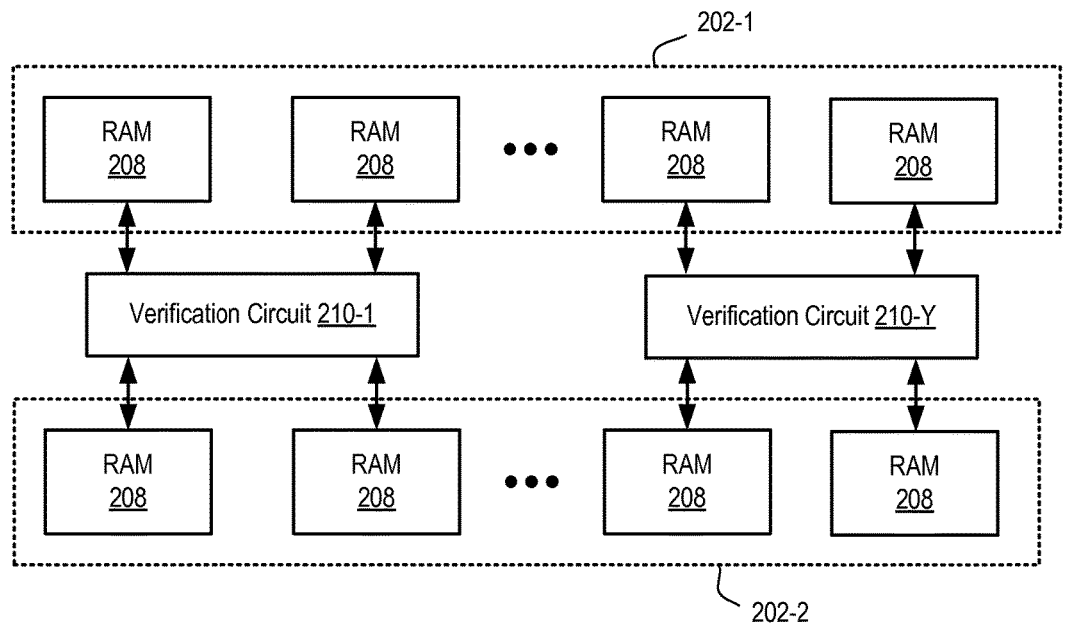

FIGS. 10A-10C are block diagrams showing different configurations for sharing a verification circuit among a plurality of RAMs. As shown in FIG. 10A, two TCAM units 202-1 and 202-2 can each include a plurality of RAMs 208. A verification circuit 210-1 can be shared by the RAMs 208 in the TCAM unit 202-1, and a verification circuit 210-2 can be shared by the RAMs 208 in the TCAM unit 202-2. Thus, each verification circuit 210 is used to verify a row of RAMs, where each row of RAMs emulates a TCAM unit. The verification circuit 210-1 can be used to verify the RAMs 208 in the TCAM unit 202-1 either sequentially or concurrently (in parallel). Likewise, the verification circuit 210-2 can be used to verify the RAMs 208 in the TCAM unit 202-2 either sequentially or concurrently (in parallel). Each of the verification circuits 210-1 and 210-2 can perform one or more verification operations, such as the decoding operation and checking operation described above. Each of the verification circuits 210-1 and 210-2 can perform a plurality of verification operations either sequentially or concurrently (in parallel). The configuration of FIG. 10A can be repeated for a plurality of TCAM units.

As shown in FIG. 10B, a verification circuit 210-1 is shared by first RAMs 208 in each of the TCAM units 202-1 and 202-2, a verification circuit 210-2 is shared by second RAMs 208 in each of the TCAM units 202-1 and 202-2, and so on until a verification circuit 210-X is shared by the X-th RAMs 208 in each of the TCAM units 202-1 and 202-2. Thus, each verification circuit 210 is used to verify a column of RAMs, where each column of RAMs comprises RAMs from a plurality of TCAM units. The verification circuits 210-1 through 210-X can operate as described in FIG. 10A. The configuration of FIG. 10B can be repeated for a plurality of TCAM units.

As shown in FIG. 10C, a verification circuit 210-1 is shared by two RAMs 208 in each of the TCAM units 202-1 and 202-2 and so on unit a verification circuit 210-Y is shared by two RAMs 208 in each of the TCAM units 202-1 and 202-2. Thus, each verification circuit 210 is used to verify a matrix of RAMs, where each matrix of RAMs comprises a plurality of RAMs from each of a plurality of TCAM units. The verification circuits 210-1 through 210-Y can operate as described in FIG. 10A. The configuration of FIG. 10C can be repeated for a plurality of TCAM units.

FIGS. 10A-10C show just three example configurations of sharing verification circuit(s) 210 among a plurality of RAMs. Other configurations are possible. In general, a given verification circuit 210 can be shared among a plurality of RAMs in one or more TCAM units.

While the foregoing is directed to specific examples, other and further examples may be devised without departing from the basic scope thereof, and the scope thereof is determined by the claims that follow.

What is claimed is:
1. An integrated circuit (IC), comprising:
  a memory including at least one random access memory (RAM); and
  a verification circuit, coupled to the memory, including a W-bit address bus and an N-bit data bus coupled to each of the at least one RAM, a counter coupled to the address bus and operable to generate a W-bit address signal, a register coupled to the address bus and operable to store a W-bit address value, a multiplexer coupled to the data bus and operable to output a selected bit of the data bus, and circuitry configured to decode or check bits stored in the memory based on output of the register and output of the multiplexer.

2. The IC of claim 1, wherein the circuitry is configured to generate a data word and a mask word as output responsive to the output of the register and the output of the multiplexer.

3. The IC of claim 1, wherein the circuitry is configured to further receive a data word; and a mask word as input and to provide a one-bit indicator as output responsive to the output of the register, the output of the multiplexer, the data word, and the mask word.

4. The IC of claim 1, wherein the circuitry of the verification circuit comprises:
a decoder circuit coupled to the register and the multiplexer and operable to output a W-bit data word and a W-bit mask word.

5. The IC of claim 4, further comprising:
a controller coupled to the counter and the multiplexer, the controller operable to reset the counter and to control the bit of the N-bit word selected by the multiplexer.

6. The IC of claim 1, wherein the circuitry of the verification circuit comprises:
a compare circuit coupled to the register and the multiplexer, the compare circuit operable to receive a W-bit data word and a W-bit mask word, and output a one-bit error signal.

7. The IC of claim 6, further comprising:
a controller coupled to the counter and the multiplexer, the controller operable to reset the counter and to control the bit of the N-bit word selected by the multiplexer.

8. The IC of claim 1, wherein the at least one RAM comprises a plurality of RAMs.

9. The IC of claim 8, wherein the plurality of RAMs comprise a row of RAMs, a column of RAMs, or a matrix of RAMs.

10. A method of verifying a random access memory (RAM)-based ternary content addressable memory (TCAM), comprising:
sending addresses to a RAM emulating at least a portion of a TCAM, the addresses being search keys, the RAM storing match vectors indicative of whether the search keys match ternary rules, the addresses generated by a counter coupled to an address bus of the RAM;
selecting, by a multiplexer coupled to a data bus of the RAM, bits from words output by the RAM in response to the addresses; and
generating a data word and a mask word representing a ternary rule in response to the addresses and the bits.

11. The method of claim 10, wherein the at least a portion of the TCAM has a depth of N and a width of W, the addresses comprise $2^W$ addresses, the words comprise $2^W$ words each including N bits, and the bits comprise $2^W$ bits each being an nth bit of a word.

12. The method of claim 11, wherein the operation of generating comprises:
performing, for each address of the addresses and a corresponding bit of the bits, an operation of:
updating a first value to be a logical AND of the first value and the address if the corresponding bit is a logical '1'; or
maintaining the first value if the corresponding bit is a logical '0'.

13. The method of claim 12, wherein the operation of generating further comprises:
performing, for each address of the addresses and a corresponding bit of the bits, an operation of:
updating a second value to be a logical OR of the second value and the address if the corresponding bit is a logical '1'; or
maintaining the second value if the corresponding bit is a logical '0'.

14. The method of claim 13, wherein the operation of generating further comprises:
outputting the first value as the data word for the ternary rule; and
outputting a combination of the first value and the second value as the mask word for the ternary rule.

15. The method of claim 14, wherein the combination of the first value and the second value comprises an exclusive combination of the first and second values.

16. A method of verifying a random access memory (RAM)-based ternary content addressable memory (TCAM), comprising:
sending addresses to a RAM emulating at least a portion of a TCAM, the addresses being search keys, the RAM storing match vectors indicative of whether the search keys match ternary rules, the addresses generated by a counter coupled to an address bus of the RAM;
selecting, by a multiplexer coupled to a data bus of the RAM, bits from words output by the RAM in response to the addresses;
selecting a mask word and a data word representing content of a ternary rule; and
generating error bits representing validity of the match vectors stored in the RAM in response to the addresses, the bits, the mask word, and the data word.

17. The method of claim 16, wherein the at least a portion of the TCAM has a depth of N and a width of W, the addresses comprise $2^W$ addresses, the words comprise $2^W$ words each including N bits, and the bits comprise $2^W$ bits each being an nth bit of a word.

18. The method of claim 17, wherein the operation of generating comprises:
performing for each address of the addresses and a corresponding bit of the bits, operations of:
comparing the address with a combination of the data word and the mask word to generate a one-bit comparison value;
comparing the one-bit comparison value with the corresponding bit to generate an error bit.

19. The method of claim 18, wherein the operation of comparing the one-bit comparison value and the corresponding bit comprises exclusive ORing the one-bit comparison value with the corresponding bit.

* * * * *